United States Patent [19]

Suda et al.

[11] Patent Number: 4,510,412
[45] Date of Patent: Apr. 9, 1985

[54] PIEZOELECTRIC DISPLACING DEVICE

[75] Inventors: Yoshiyuki Suda, Yokohama; Katsunori Yokoyama, Ebina; Chiaki Tanuma, Tokyo, all of Japan

[73] Assignee: Tokyo Shibaura Denki Kabushiki Kaisha, Kawasaki, Japan

[21] Appl. No.: 528,841

[22] Filed: Sep. 2, 1983

[30] Foreign Application Priority Data

Sep. 3, 1982 [JP] Japan .................. 57-152554

[51] Int. Cl.³ ........................... H01L 41/08
[52] U.S. Cl. .................................. 310/328
[58] Field of Search .............. 310/328, 331, 332

[56] References Cited

U.S. PATENT DOCUMENTS

| 2,883,486 | 4/1959 | Mason | 310/328 X |
| 3,154,700 | 10/1964 | McNaney | 310/328 |
| 4,423,347 | 12/1983 | Kleinschmidt et al. | 310/328 X |

FOREIGN PATENT DOCUMENTS

| 35994 | 3/1977 | Japan | 310/328 |
| 2087660 | 5/1982 | United Kingdom | 310/328 |
| 0640385 | 12/1978 | U.S.S.R. | 310/328 |

OTHER PUBLICATIONS

Japanese Journal of Applied Physics, vol. 20, (1981), Supplement 20-4, pp. 93-95, "Piezoelectric Pile", S. Yamashita.
J. Guidance and Control, vol. 4, No. 1, Jan.-Feb., (1981), pp. 27-34, "Deformable Mirror Surface Control Techinques", D. J. Chiarappa et al.

Primary Examiner—Mark O. Budd
Attorney, Agent, or Firm—Oblon, Fisher, Spivak, McClelland & Maier

[57] ABSTRACT

A piezoelectric displacing device includes a plurality of longitudinal effect-type piezoelectric displacing members arranged juxtaposed to each other such that displacement axes thereof are substantially parallel to each other, each of said piezoelectric displacing member converting a voltage applied thereto to a mechanical displacement. Connectors are provided which mechanically connect the piezoelectric displacing members in series with each other and derive a sum of amounts of displacement of the piezoelectric displacing members along the displacement axes thereof to give an amount of displacement of the device.

6 Claims, 9 Drawing Figures

PIEZOELECTRIC DISPLACING DEVICE

BACKGROUND OF THE INVENTION

1. Field of the Invention

The present invention relates to a piezoelectric displacing device which utilizes the longitudinal effect of a piezoelectric material.

2. Description of the Prior Art

In a longitudinal effect-type piezoelectric displacing device, when a signal voltage is applied to a piezoelectric element, the element expands/contracts in the direction along the axis of an electric field acting thereupon. Thus, if one end of the element is fixed in position, the other end thereof is displaced. The element of such a device generally consists of PZT or a ternary polycrystalline material. In order to prepare a piezoelectric displacing element, the piezoelectric material is formed into a column 1, and a DC high voltage is applied to the column along an axis parallel to the central axis of the column 1 for polarization along this axis, as shown in FIG. 1. The polarized element has a "polarization direction" along the axis parallel to the central axis, and exhibits piezoelectricity which depends on this polarization direction. When electrodes 2 are formed on two end faces of the column 1 and a signal voltage $V_1$ is applied between the electrodes 2 so as to apply an electric field in the polarization direction, the element expands/contracts in the direction of the axis parallel to the central axis of the column 1 in correspondence with the polarity of the voltage applied. When a polarization axis P, an electric field axis E and a displacement axis $\delta$ coincide with each other, this is referred to as the "longitudinal effect" of a piezoelectric material.

For a given element of such a device, the amount of displacement of a longitudinal effect-type piezoelectric displacing device is proportional to the product of an intensity of an electric field (a ratio of the signal voltage applied between the electrodes in the example of the element described above to the thickness of the piezoelectric material between the electrodes) and the size of the element along the electric field axis, that is, the length of the column. For this reason, in order to increase the amount of displacement, two methods, firstly of increasing the intensity of the electric field and secondly of increasing the length of the element along the electric field axis, are conventionally adopted. When the first method is adopted, the amount of displacement, that is, change, reaches saturation, and the degree of polarization decreases depending upon the polarity of the electric field applied. Accordingly, the degree to which the intensity of the electric field may be increased is limited; it is usually 10 to 50% of the coersive field depending on the piezoelectric material.

When the second method as described above is adopted, a device mounting such an element with an increased length becomes large in size, thus preventing actual adoption of this method. Accordingly, the amount of displacement of a longitudinal effect-type piezoelectric displacing device is limited due to limits on the intensity of the electric field applied and the size of the device along the displacement axis. For example, when a ceramic piezoelectric material is used as a displacing element, the upper limit of the piezoelectric constant associated with displacement is about $500 \times 10^{-12}$ m/V and the maximum intensity of the electric field within a normal operation range is about 1 kV/mm. In this case, if the column has a length of 10 cm, an amount of displacement of only about 50 $\mu$m is obtained. Such a longitudinal effect-type piezoelectric displacing device can be applied to various types of measuring equipment, a precision displacing device such as a processor, or a precision drive apparatus such as an X-Y table. However, it is desired to increase the amount of displacement in such a device beyond the conventionally possible level without requiring an increase in the size of the element along the displacement axis, that is, the length of the element along the electric field axis.

Meanwhile, a piezoelectric displacing device is known to have an important defect. More specifically, displacement of an element has a hysteresis characteristic with respect to an applied electric field, so that the amount of displacement and the intensity of the electric field are not linear. For this reason, the amount of displacement of the displacing device cannot be correctly controlled. It has therefore been desired to reduce this hysteresis phenomenon, i.e., the residual displacement caused after the electric field is removed.

Such residual displacement may be reduced by forming a displacing element having a structure which provides an increased amount of displacement for a given applied electric field. This method is established based on the following. In a general operation range, the displacement of an element of a piezoelectric displacing device is substantially linearly proportional to the intensity of an electric field, and the residual displacement is substantially proportional to the power of $\beta$ (where $\beta > 1$) of the electric field. FIG. 2 demonstrates this wherein the amount of displacement $\delta$ is plotted along the axis of ordinate and the intensity of the electric field E is plotted along the axis of abscissa. Curve a shows the relationship between the amount of displacement of the element and the intensity of the electric field. Curve b shows the relationship between the residual displacement and the intensity of the electric field. When the length of a displacing element utilizing the longitudinal effect is effectively increased to N times the original value and the expansion/contraction amount with respect to the intensity of the electric field is also increased to N times the original value, the proportionality constant of the amount of displacement and amount of residual displacement with respect to the intensity of the electric field is also increased to N times the original value. Accordingly, an intensity of the electric field for obtaining a desired amount of displacement is reduced to 1/N times the intensity of electric field $E_1$ before displacement sensitivity (ratio of the amount of displacement to the intensity of the electric field) is increased to N times the original value. Accordingly, if the residual displacement after obtaining a given displacement is proportional to $E_1{}^\beta$ before the displacement sensitivity is increased, it is proportional to $N(E_1/N)^\beta$ after the displacement sensitivity is increased to N times the original value. This means that when the displacement sensitivity is increased to N times the original value, the residual displacement can be reduced to $1/N^{\beta-1}$. It is concluded from this that if a small displacing device having a new structure is provided which has a constant element length along the displacement axis and which has an improved displacement sensitivity, a piezoelectric displacing device can be provided which is small in size, and is less subject to a hysteresis characteristic; that is, which has an excellent linear response characteristic of a displacement with respect to the intensity of an electric field.

SUMMARY OF THE INVENTION

It is, therefore, an object of the present invention to provide a longitudinal effect-type piezoelectric displacing device, which is capable of increasing the amount of displacement without requiring an increase in the overall length, and which has a small hysterisis characteristic and an excellent displacement sensitivity.

A piezoelectric displacing device of the present invention includes a plurality of independent longitudinal effect-type piezoelectric displacing members which convert an applied voltage to mechanical displacement and which have displacing axes substantially parallel to each other. The displacing members are juxtaposed with each other. The device also has a means for mechanically connecting the piezoelectric displacing members in series with each other and for obtaining or deriving a sum of the amounts of displacement of each piezoelectric displacing member along its displacement axis as an amount of displacement of the piezoelectric displacing device.

According to the present invention, the displacement for a given intensity of the applied electric field increases proportionally to the number of displacing members connected without requiring a change in the size of each displacing member along its displacement axis.

As may be seen from the foregoing, in a conventional piezoelectric displacing device utilizing the longitudinal effect, in order to increase the amount of displacement and sensitivity for a given intensity of an applied electric field, the length of the displacing member can only be increased along the electric field axis (displacement axis). When this measure is taken, however, the length of the displacing member must be increased to N times the original length along the axis of the displacing member so as to increase the amount of displacement to N times the original displacement. This makes the overall device elongated and prevents easy mounting of the device. In contrast to this, in a longitudinal effect-type piezoelectric displacing device of the present invention, the amount of displacement can be increased to N times the original amount by incorporating N displacing members each having N elements, which are mechanically connected in series with each other. For this reason, the amount of displacement can be increased while keeping the length of the displacing members substantially the same as that of the conventional device. In this case, the total sectional area of the members is increased only to N×N times that before mechanical series connection. Accordingly, a longitudinal effect-type piezoelectric displacing device is provided which is relatively small in size and which can increase the amount of displacement, that is, displacement sensitivity for a given intensity of an electric field. Accordingly, the device of the present invention is advantageous in that it allows assembly of a compact system. Furthermore, the device of the present invention is compact in size, provides a larger amount of displacement, and has an excellent displacing characteristic with less residual displacement. Since the device of the present invention does not use a special displacement amplifying mechanism, a conventional problem of ruggedness is not presented.

DETAILED DESCRIPTION OF THE PREFERRED EMBODIMENTS

The present invention will now be described with reference to the accompanying drawings.

Figure 1:
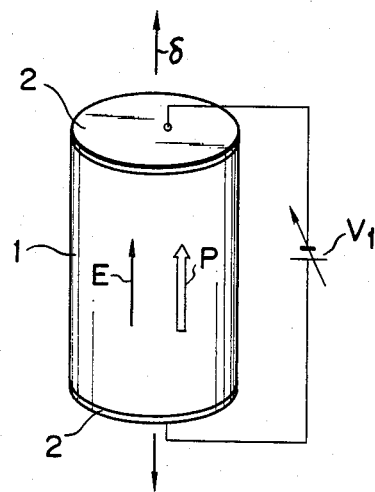
FIG. 1 is a view for explaining the principle of a longitudinal effect-type piezoelectric displacing device.
Figure 2:
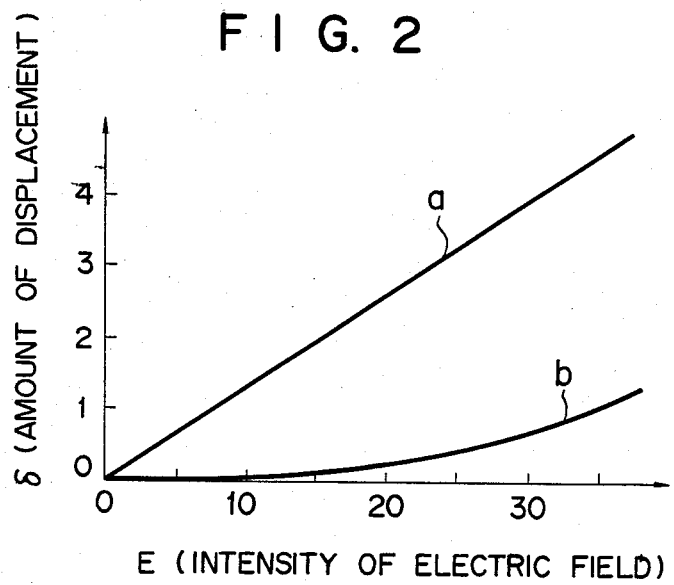
FIG. 2 is a graph showing the relationships among the intensity of an electric field, the amount of displacement, and the amount of residual displacement.
Figure 3:
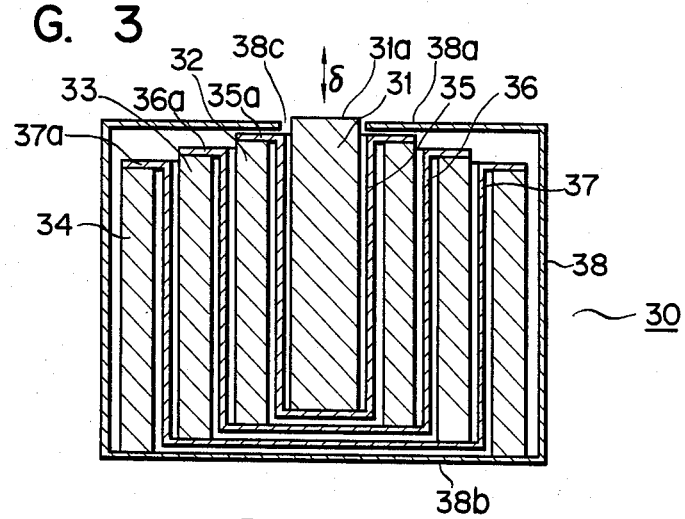
FIG. 3 is a schematic sectional view showing a piezoelectric displacing device according to an embodiment of the present invention.

FIG. 3 shows a piezoelectric displacing device 30 according to the first embodiment of the present invention. The device 30 has a columnar piezoelectric displacing member 31 and three cylindrical piezoelectric displacing members 32, 33 and 34 which have substantially the same length; and three cylindrical connectors 35, 36 and 37 with bottoms which mechanically connect the members 31, 32, 33 and 34 in series with each other. Each cylindrical connector 35, 36 or 37 has an annular flange 35a, 36a or 37a which extends horizontally outward from the open edge thereof.

The columnar displacing member 31 is concentrically housed in the first cylindrical connector 35 at a distance therefrom, and has its lower end face fixed to the bottom surface of the cylindrical connector 35. A free end 31a of the member 31 projects beyond the flange 35a of the connector 35.

The first cylindrical displacing member 32 is arranged to concentrically surround the first connector 35 at a distance therefrom. The upper end face of the member 32 engages with and is fixed to the rear surface of the flange 35a of the connector 35. The lower end face of the member 32 is fixed to and is supported by the bottom surface of the second connector 36 concentrically holding it therein at a distance therefrom. The bottom surface of the connector 36 is spaced apart from the bottom surface of the connector 35.

Similarly, the second cylindrical displacing member 33 is arranged to concentrically surround the connector 36 at a distance therefrom. The upper end face of the member 33 engages with and is fixed to the rear surface of the flange 36a of the connector 36. The lower end face of the member 33 is fixed to and is supported by the bottom surface of the third connector 37 concentrically holding it therein at a distance therefrom.

The third cylindrical displacing member 34 concentrically surrounds the third cylindrical connector 37 at a distance therefrom. The upper end face of the member 34 engages with and is fixed to the rear surface of the flange 37a of the connector 37. The lower end face of the member 34 is fixed to and is supported by a bottom surface 38b of a casing 38 for holding the overall device therein. The bottom surface 38b of the casing 38 is spaced apart from the bottom surface of the connector 37. A window larger than the member 31 is formed in a position of a top surface 38a of the casing 38 which corresponds to the member 31 so as to allow passage of the member 31 therethrough. The lower end of the member 34 is a fixed end of the overall device, and the upper end 31a of the member 31 is the free end E of the overall device.

Figure 4:
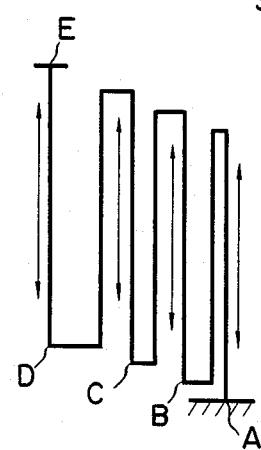
FIG. 4 is a representation for explaining the displacement of the device shown in FIG. 3.

The piezoelectric displacing device 30 having the structure as described above displaces (expands/contracts) from point A as shown by arrows in FIG. 4. The member 34 displaces about the point A, the member 33 displaces about point B, the member 32 displaces about point C, and the member 31 displaces about point D. Thus, the free end E (the upper end 31a of the member 31) is moved upward or downward according to a polarity of the applied electric field.

In other words, while the length of the overall device remains substantially the same as that of each displacing member, a displacement characteristic equivalent to that of a member of a length substantially four times that of a single member used in the device of the present invention can be obtained. When a voltage is applied to the device, the amount of displacement at the point E shown in FIG. 4 for a given intensity of an applied electric field can be about four times that obtained when a single displacing member is used.

Thermal expansion of each connector is negligible since the device is hardly subject to any heat. However, where necessary, rigid stoppers for preventing displacement due to thermal expansion may be inserted in the gaps between the bottoms of the respective connectors.

Figure 5:
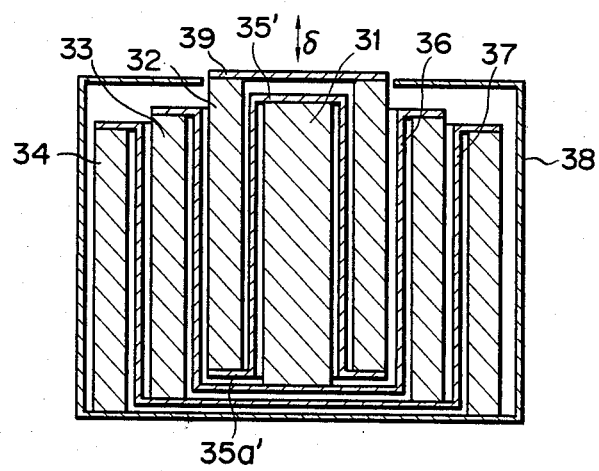
FIG. 5 is a schematic sectional view showing a modification of the piezoelectric displacing device shown in FIG. 3.

FIG. 5 shows a modification of the device shown in FIG. 3. The same reference numerals as used in FIG. 3 denote the same parts, and a detailed description thereof will be omitted. The device shown in FIG. 5 has a connector 35' obtained by inverting the connector 35 of the device shown in FIG. 3. The upper and lower ends of the columnar displacing member 31 are fixed between the closed end of the connector 35' and the bottom surface of the connector 36. The lower end face of the first cylindrical displacing member 32 is fixed to and is supported by a flange 35a' of the connector 35'. The bottom surfaces of the flange 35a' and the connector 36 are spaced apart from each other. The upper end (free end) of the first cylindrical displacing member 32 projects above the top surface of the connector 35' and a disc plate 39 covers the upper, open end of the connector 35'. The disc plate 39 provides a wide displacement surface.

Figure 6:
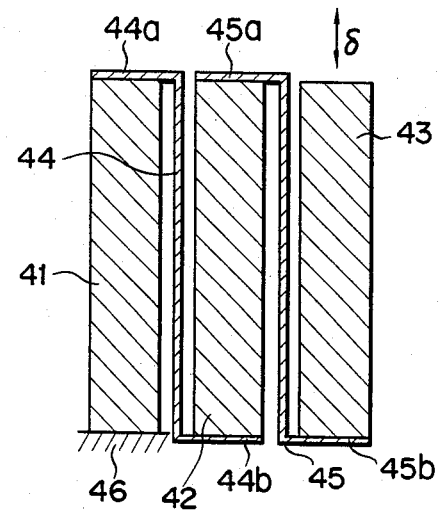
FIGS. 6 and 7 are views of piezoelectric displacing devices according to other embodiments of the present invention.

FIG. 6 shows another embodiment of the present invention wherein three columnar piezoelectric displacing members 41, 42 and 43 of the same length are connected by two connectors (cranks) 44 and 45 such that the displacements are in series with each other. The lower end of the member 41 is fixed to a stationary base 46 and the upper end thereof is fixed to an upper branch 44a of the crank 44. The lower end of the member 42 is fixed to and is supported by a lower branch 44b of the crank 44 extending in a direction opposite to the upper branch 44a. The upper end of the member 42 is fixed to an upper branch 45a of the crank 45. The lower end of the member 43 is fixed to and is supported by a lower branch 45b of the crank 45, and the upper end thereof is a free end at which displacement of the device occurs.

Figure 7:
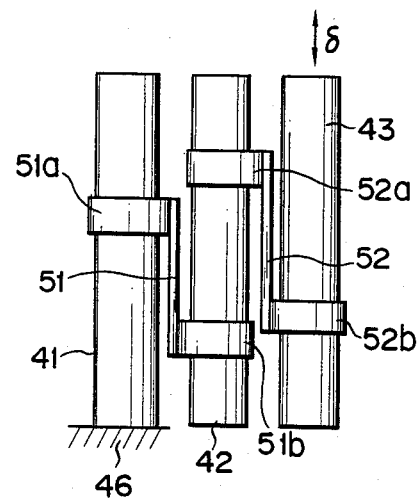

FIG. 7 shows an embodiment wherein respective columnar piezoelectric displacing members 41, 42 and 43 are connected at their intermediate portions by connectors 51 and 52. Each connector 51 or 52 has clamps 51a and 51b or 52a and 52b for clamping and holding the members 41, 42 and 43.

In each embodiment, each connector connects adjacent displacing members at different positions along the displacement axis.

Figure 8A:
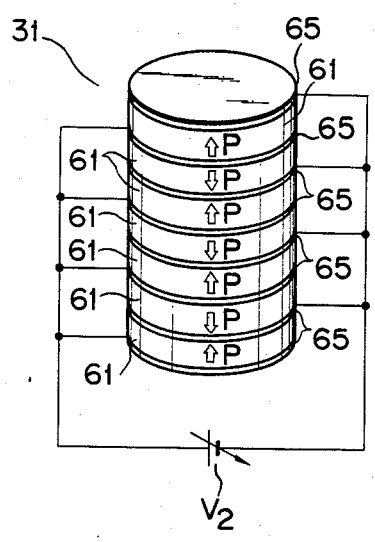
FIGS. 8A and 8B are perspective views showing piezoelectric displacing members used in the device of the present invention.

In each of the embodiments described above, each piezoelectric displacing member such as a columnar displacing member 31 preferably has a structure wherein a piezoelectric material such as a ternary piezoelectric material $(Pb, Sr)[(Y_{\frac{1}{2}} Nb_{\frac{1}{2}}), Ti, Zr]O_3$ is formed into a disc shape, and resultant disc-shaped piezoelectric elements 61 are stacked through respective electrodes 65, as shown in FIG. 8A.

The polarization directions P of adjacent elements 61 are opposite to each other along the axial direction and a signal voltage V2 is applied to the elements 61 in parallel with each other. Then, a predetermined voltage can be easily applied to the displacing member 31 and so on, and the device can operate with a low voltage.

Figure 8B:
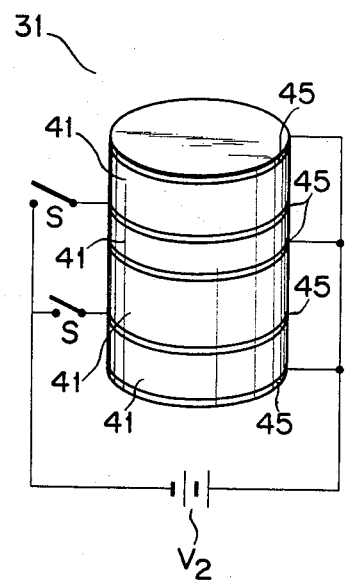

As shown in FIG. 8B, each element 61 can have a different length along the axial direction of the element. Also, a voltage can be applied only to selected elements using switches S so as to freely adjust the amount of displacement. Then, the amount of displacement of the free end E of the displacing member 31 can be finely adjusted, and the range of adjustment is widened.

In each of the embodiments described above, each connector is preferably formed of a material such as stainless steel, which has a great tensile strength, a small Young's modulus and a small coefficient of thermal expansion.

If some of the piezoelectric displacing members have different displacing characteristics from others thereof, the amount of displacement can be further freely adjusted, and the length thereof can be increased/decreased freely. Some of the piezoelectric displacing members may be fixed to have opposite directions of expansion/contraction and can be used as adjusting elements.

What is claimed is:

1. A piezoelectric displacing device comprising:
   displacing means including a plurality of displacing members each including a plurality of stacked longitudinal effect type piezoelectric elements, said piezoelectric elements in each displacing member being stacked such that displacement axes thereof are in the same direction, said displacing members being arranged juxtaposed to each other in a direction normal to the displacement axes of said piezoelectric elements and converting a voltage applied thereto to a mechanical displacement; and
   a plurality of connecting means for mechanically connecting adjacent displacing members in series with each other, each of said connecting members having a first member extending parallel to said displacement axes and arranged between said adjacent displacing members, a second member extending from said first member to one of said adjacent displacing members and a third member extending from said first member to the other of said adjacent displacing members, second and third members being connected at different positions along the displacement axis of said adjacent displacing members for deriving a sum of amounts of displacement of said piezoelectric displacing members along the displacement axes thereof to give an amount of displacement of said device.

2. A device according to claim 1, wherein said displacing means comprises one columnar piezoelectric displacing member and at least one cylindrical piezoelectric displacing member arranged to surround said columnar piezoelectric displacing member and concentric therewith; said connecting means comprises at least one cylindrical body with a bottom and having a flange extending outward from an open edge thereof; said columnar piezoelectric displacing member is fixed to and is supported by a bottom of an innermost one of said at least one cylindrical body; and an innermost one of said at least one cylindrical piezoelectric displacing members engages with and is fixed at an upper end thereof to said flange of said connecting means arranged inwardly thereof.

3. A device according to claim 1, wherein said displacing means comprises a plurality of columnar piezoelectric displacing members, and said connecting members connects adjacent two of said columnar piezoelectric displacing members at different positions along the displacement axes thereof.

4. A device according to claim 1, wherein at least one of said displacing members has an amount of displacement different from the amount of displacement of remaining ones of said displacing members.

5. A device according to claim 1, wherein at least one of said displacing members has a displacing direction different from the displacing directions of remaining ones of said displacing members.

6. A device according to claim 1, wherein each of said displacing members comprises a plurality of stacked piezoelectric elements and a plurality of electrode layers interposed between said piezoelectric elements.

* * * * *